United States Patent [19]

Hagner

[11] Patent Number: 4,889,962
[45] Date of Patent: Dec. 26, 1989

[54] CIRCUIT BOARD WITH COAXIAL CIRCUIT AND METHOD THEREFOR

[75] Inventor: George R. Hagner, Cary, N.C.

[73] Assignee: Northern Telecom Limited, Montreal, Canada

[21] Appl. No.: 233,815

[22] Filed: Aug. 19, 1988

[51] Int. Cl.$^4$ .......................... H05K 1/00; H05K 3/00
[52] U.S. Cl. ........................................ 174/68.5; 29/829; 29/852
[58] Field of Search ..................... 174/68.5, 258, 251, 174/255; 29/829, 831, 852; 156/901

[56] References Cited

U.S. PATENT DOCUMENTS

| | | | |
|---|---|---|---|
| 2,772,501 | 12/1956 | Malcolm | 156/223 |
| 2,961,746 | 11/1960 | Lyman | 29/848 |
| 3,042,591 | 7/1962 | Cado | 204/15 |
| 3,081,525 | 3/1963 | Delbove | 29/847 |
| 3,281,627 | 10/1966 | Fetterolf et al. | 174/68.5 |
| 3,434,939 | 3/1969 | Mickelson et al. | 204/15 |
| 3,670,205 | 6/1972 | Dixon et al. | 317/101 CE |
| 3,851,382 | 12/1974 | Stork | 29/578 |
| 3,922,479 | 11/1975 | Older et al. | 174/68.5 |
| 3,934,336 | 1/1976 | Morse | 29/627 |
| 4,080,513 | 3/1978 | Cuneo et al. | 174/68.5 |
| 4,159,222 | 6/1979 | Lebow et al. | 156/632 |
| 4,223,321 | 9/1980 | Kenworthy | 29/846 X |
| 4,306,935 | 12/1981 | Graham | 162/227 |
| 4,328,530 | 5/1982 | Bojorek et al. | 361/308 |
| 4,363,930 | 12/1982 | Hoffman | 174/68.5 |
| 4,402,135 | 9/1983 | Schweingruber et al. | 29/832 |
| 4,604,678 | 8/1986 | Hagner | 174/68.5 X |
| 4,734,457 | 3/1988 | Doe, Jr. | 525/149 |

FOREIGN PATENT DOCUMENTS 1457805 12/1976 United Kingdom .
2033667 5/1980 United Kingdom .

Primary Examiner—Morris H. Nimmo
Attorney, Agent, or Firm—Foley & Lardner, Schwartz, Jeffery, Schwaab, Mack, Blumenthal & Evans

[57] ABSTRACT

A circuit board having coaxial circuits and a method for making a circuit board of that type. A circuit board having grooves in its upper surface is made according to known techniques. Next, an inner conductor for the coaxial circuits is made. A copper backing plate, holding what will become the inner conductors, is produced. The grooves which are to receive coaxial circuits are partially filled with a fluid insulator. The copper backing plate is placed above the groove on the circuit board and lowered such that the copper tracks enter into the grooves on the circuit board and are centered within the recessed circuitry of the circuit board. The assembly is then cured by heat such that the epoxy becomes a solid and holds the copper tracks in place. The assembly is put into an etching tank which will react only with the copper so that the total copper backing plate is removed, leaving only the copper tracks embedded in the grooves.

12 Claims, 4 Drawing Sheets

CIRCUIT BOARD WITH COAXIAL CIRCUIT AND METHOD THEREFOR

This invention relates generally to circuit boards, and more specifically to a circuit board containing coaxial circuits.

BACKGROUND OF THE INVENTION

Printed circuit boards and molded circuit boards are well known and are referred to generally as circuit boards. Some examples of molded circuit boards in the art are described in the following U.S. patents: U.S. Pat. No. 4,604,678 dated Aug. 5, 1986 by George R. Hagner entitled "Circuit Board with High Density Electrical Tracers"; and U.S. Pat. No. 4,080,513 by E. A. Cuneo et al dated Mar. 21, 1978 entitled "Molded Circuit Board Substrate".

In general terms, a molded circuit board is not unlike a conventional printed circuit board (PCB) in that it provides interconnections between electrical components mounted thereon. However, it does differ in that the electrical tracks on the circuit board consist of grooves recessed into the board surface.

One difficulty with circuit boards, either molded or of the PCB variety, is that they do not readily provide the capability of providing coaxial circuits. For straight electrical interconnection of components they work very well; but difficulties do arise when trying to form a coaxial conductor on a PCB or molded circuit board. The following U.S. patent refers generally to the construction of coaxial circuits on PCBs: U.S. Pat. No. 3,922,479 by R. B. Older et al dated Nov. 25, 1975 and entitled "Coaxial Circuit Construction and Method of Making".

SUMMARY OF THE INVENTION

The present invention is a circuit board having coaxial circuits and a method for making a circuit board of said type. To practice the present invention, a circuit board having grooves in its upper surface is made according to known techniques. The next step is to make an inner conductor for the coaxial circuits. The process begins with a copper-backed plastic film, the copper of which is approximately 1 mil thick, and the plastic is approximately 15 mils thick. This copper-backed plastic is then bonded to a flat steel backing plate using a heat releasable glue; the copper side of the copper-backed plastic film is next to the steel backing plate. This results in a three layer assembly, the three layers being the steel backing plate, the copper layer, and the plastic layer respectively. A laser beam is then used to cut the desired pattern in the plastic film, right down to the copper, so that the copper layer is just exposed. Then an electrolytic plating process is used to fill the grooves, just cut, with copper. The copper is plated to a depth equal to the thickness of the plastic film (15 mils, in this instance). Then the plastic layer is removed by a chemical etching process.

Then, returning to the circuit board, the circuit board has its recesses which are to receive coaxial circuits filled approximately ⅞ths full with a fluid insulator such as an epoxy. The copper circuit that was attached to the steel backing plate described above is placed above the grooves on the circuit board and lowered such that the copper tracks enter into the grooves on the circuit board and are centered within the recessed circuitry of the circuit board. The assembly is then cured by heat such that the epoxy becomes a solid and holds the copper tracks in place and the heat releasable glue holding the steel backing plate to the copper comes loose and the steel backing plate is removed. This assembly is then put into an etching tank containing an etchant which will react only with the copper so that the total copper backing plate that used to be on the plastic is removed. This leaves the copper tracks embedded in the grooves in the circuit board and the end result becomes a coaxial signal carrier.

BRIEF DESCRIPTION OF THE DRAWINGS

The invention will now be described in more detail with reference to the accompanying drawings, wherein like parts in each of the several figures are identified by the same reference characters, and wherein.

DETAILED DESCRIPTION

Figure 1:
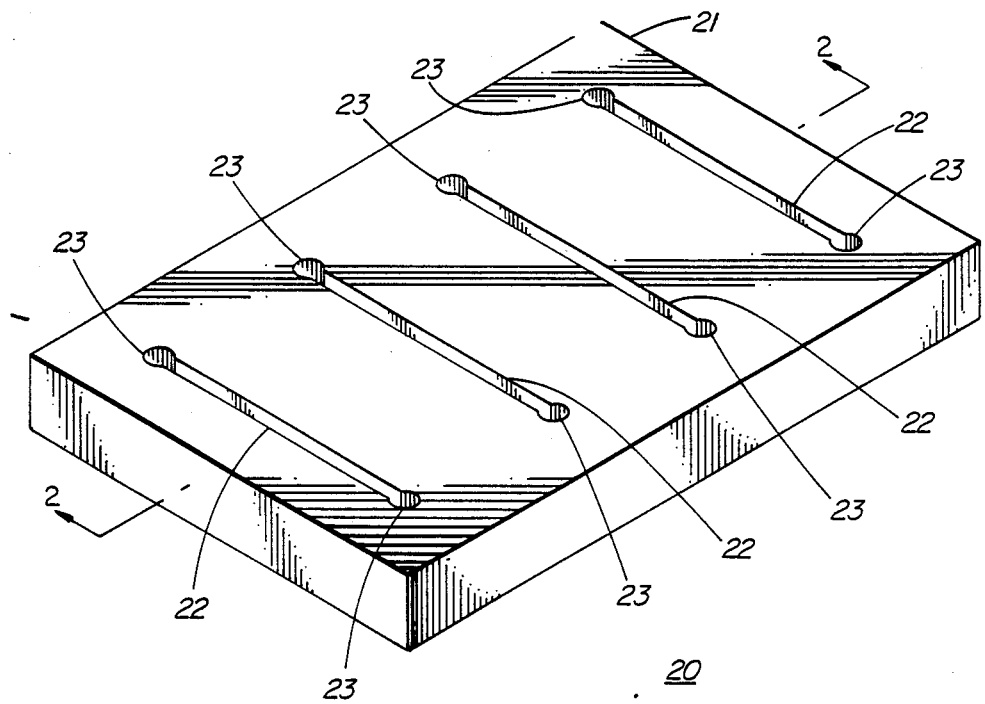
FIG. 1 is a simplified perspective view of a molded circuit board 20 without coaxial conductors.

FIG. 1 is a simplified perspective view of a molded circuit board 20 without coaxial connections or conductors and not unlike prior molded circuit boards. Molded circuit board 20 is comprised of a planar plastic material 21 containing traces (or grooves) 22 which end in holes 23. Generally, a molded circuit board of this type would carry a much more complex pattern of traces 22. However, in order not to obviate the present invention, a simplified circuit has been shown.

Figure 2:
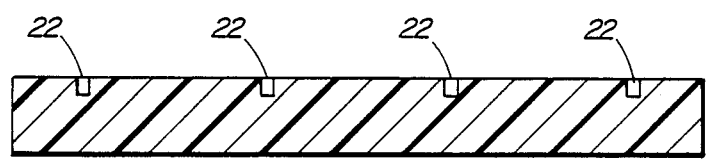
FIG. 2 is a cross-section of the FIG. 1 view through the section lines II—II of FIG. 1.

FIG. 2 is a cross-section of the molded circuit board 20 of FIG. 1, taken through the section lines 2—2 of FIG. 1.

Figure 3:
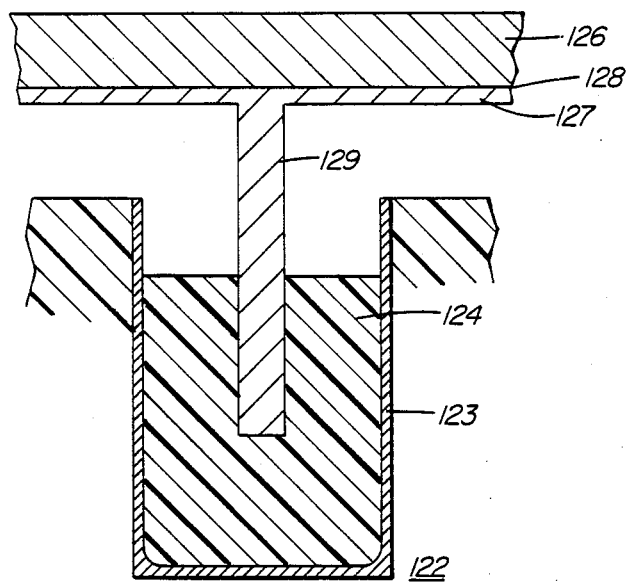
FIG. 3 illustrates one step in the construction of a coaxial circuit according to the present invention.

FIG. 3 depicts an enlargement of the groove 22 of FIG. 2 referred to in FIG. 3 as groove 122 and depicts how it is transformed into a coaxial circuit. Groove 122 has a metallic coating or plating 123 (e.g. tin plated copper), as shown in FIG. 3. Groove 122 is then filled approximately ⅞ths full with an epoxy 124. Steel backing plate 126 has attached thereto a copper plate 127 which supports projections 129. A heat releasable glue 128 bonds the steel backing plate 126 to the copper plate 127.

Figure 4:
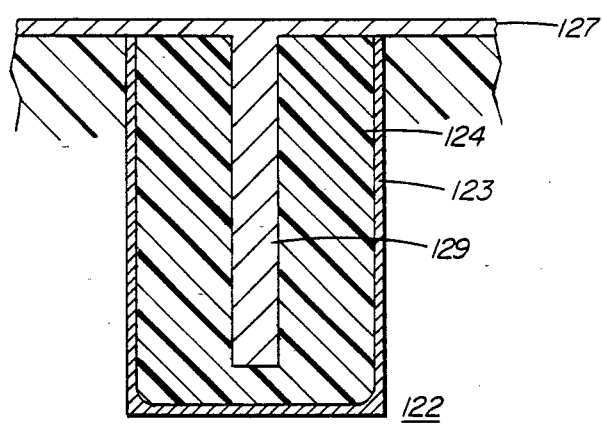
FIG. 4 illustrates a second step in the construction of a coaxial circuit according to the present invention.

FIG. 4 depicts the next stage in the construction process. The copper plate 127, along with its protrusion 129 has now been inserted completely into the groove 122. That is, as completely as can be allowed by the copper backing plate 127. In the process, the epoxy layer 124 has risen to touch or to approximately touch the lower surface of the copper backing plate 127. The FIG. 4 embodiment has been heated. In the process of this heating, the glue 128 released its bond on backing plate 126, which has now been removed from the FIG. 4 embodiment. Additionally, the epoxy 124 has been heat set and is now a hard material.

Figure 5:
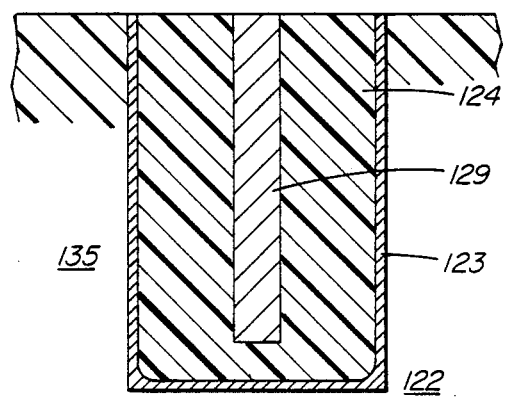
FIG. 5 illustrates a third step in the construction of a coaxial circuit according to the present invention.

FIG. 5 depicts the completion of the next stage of the process. In that step, the assembly of FIG. 4 was subjected to an etching process wherein the copper backing plate 127 was completely removed leaving only a copper protrusion 129. FIG. 5 depicts the completed coaxial circuit 135.

Figure 6:
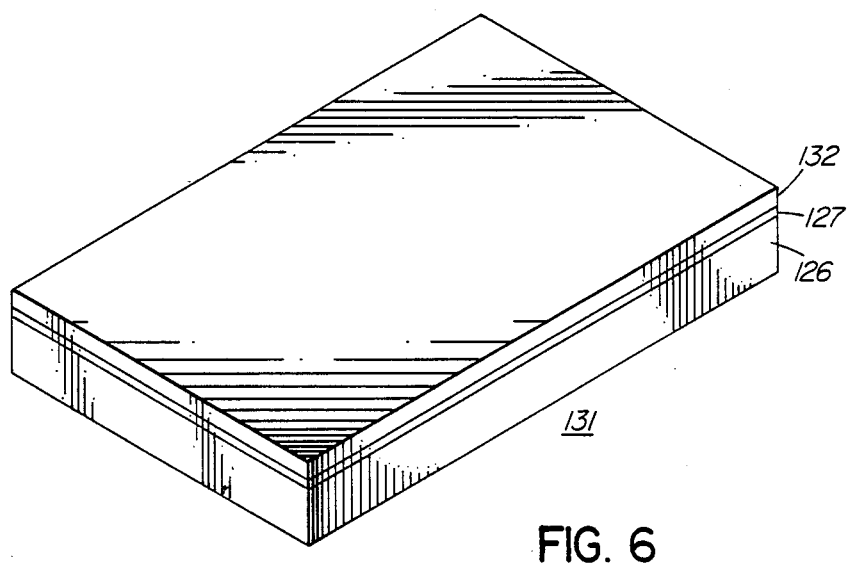
FIG. 6 illustrates a perspective view of the starting material for constructing the coaxial circuit of the present invention.

Now that the coaxial assembly has been described, the construction of the copper protrusion will be described in more detail. FIG. 6 depicts the starting assembly for producing the copper protrusion 129. Assembly 131 of FIG. 6 comprises three approximately rectangular and planar members. They are steel backing plate 126, copper backing plate 127, and plastic layer 132. The steel backing plate 126 is approximately ¼" thick; the copper layer 127 is approximately 1 mil thick; and the plastic layer 132 is approximately 15 mils thick. The copper layer 127 and the plastic layer 132 form the copper backed plastic film referred to earlier.

Figure 7:
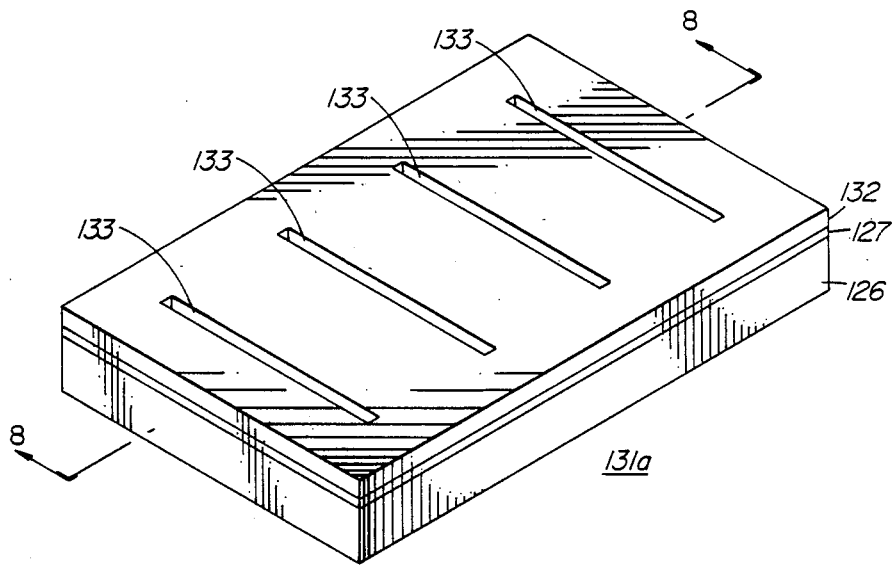
FIG. 7 is similar to FIG. 6 but additionally shows tracks cut into the material.

Turning now to FIG. 7, it can be seen that the top plastic layer 132 has grooves cut therein identified by the numeral 133. The grooves 133 correspond to the copper protrusions 129; this correspondence will become clear as the description progresses.

Figure 8:
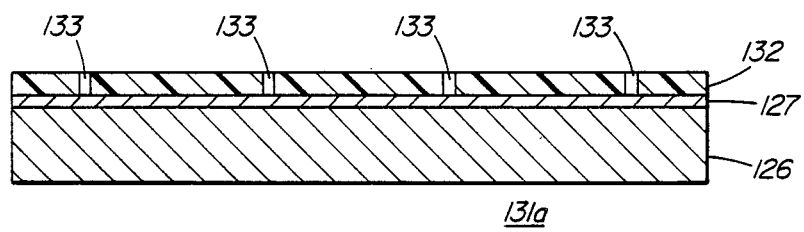
FIG. 8 is a sectional view taken through the section lines VIII—VIII of FIG. 7.

FIG. 8 is a cross-section of the FIG. 7 assembly, taken through the section lines 8—8 of FIG. 7. It can be seen from FIG. 8 that the assembly 131a is a three-layer assembly with a steel backing plate 126, copper layer 127, and a plastic layer 132 with the openings or grooves 133 in it. This assembly 131a is then placed into an electrolytic plating bath wherein copper from the solution is plated onto the copper layer 127 in the areas of the holes or grooves 133. In other words, the plastic layer 132 acts as a mask and copper is built up onto the copper backing plate 127 in the specific areas of the grooves 133. The plating process continues until the copper has built up approximately to the level of the top of the plastic layer 132. The copper that is built up in the grooves 133 is the copper that becomes the projections 129. Plastic layer 132 is then removed by chemical etching.

Figure 9:
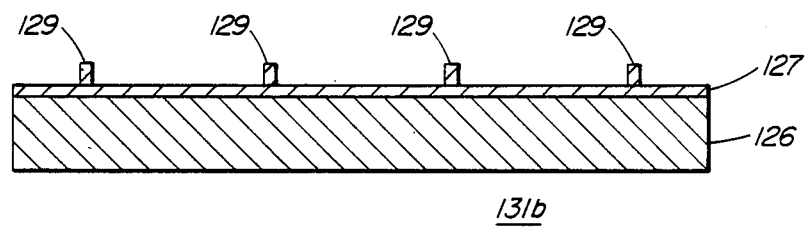
FIG. 9 is similar to FIG. 8 but has one layer of material removed.
Figure 10:
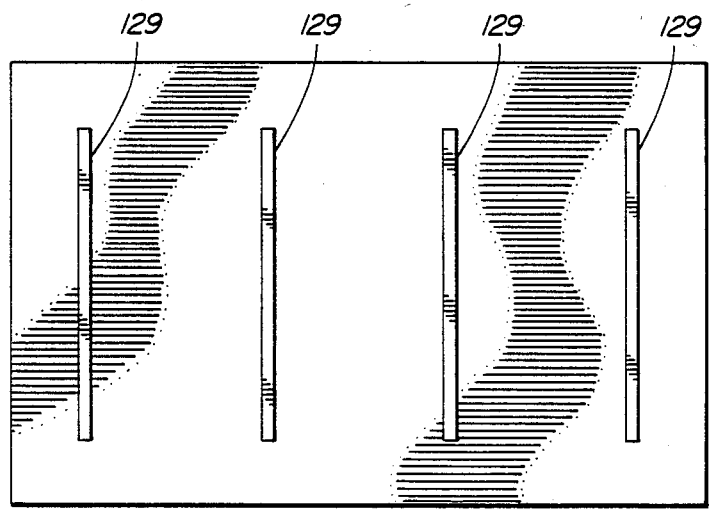
FIG. 10 is a plan view of the FIG. 9 embodiment.

FIG. 9 depicts the end result of this process. That is, FIG. 9 depicts assembly 131b with the steel backing plate 126 carrying the copper backing plate 127, which in turn carries the copper protrusions 129. As can be seen from FIG. 9, everywhere there was a groove 133 in the FIG. 8 embodiment, there is now a copper protrusion 129. FIG. 10 is a plan view of the FIG. 9 embodiment showing the copper protrusions in plan view so that their length can be seen.

What is claimed is:

1. A circuit board having at least one coaxial circuit, said circuit board comprising:
    an electrically insulative substrate having at least one generally planar face and carrying at least one groove;
    said at least one groove having a plating of conductive material and containing a solid heat curable insulator which has embedded therein an elongated conductor.

2. The circuit board of claim 1 wherein said groove has an approximately rectangular cross-section.

3. The circuit board of claim 1 wherein said plating is tin plated copper.

4. The circuit board of claim 1 wherein said heat curable insulator is an epoxy.

5. A circuit board having at least one generally coaxial circuit, said circuit board comprising:
    an electrically insulative substrate having at least one generally planar face carrying at least one groove;
    said at least one groove having an approximately rectangular cross-section, having a relatively thin plating of conductive material, and containing a solid heat curable insulator which supports an elongate conductor;
    said elongate conductor having an approximately rectangular cross-section; said elongate conductor being in contact with said solid insulator on at least three sides of said conductor, and spaced apart from said conductive plating; and
    said elongate conductor having approximately all of its mass below the planar surface of said circuit board.

6. The circuit board of claim 5, said groove is plated with tin plated copper.

7. The circuit board of claim 5 wherein said elongate conductor is made of copper.

8. The circuit board of claim 5, 6 or 7 wherein one outer surface of said elongate conductor is approximately flush with the outer planar surface of said circuit board.

9. A method of making a coaxial circuit on a circuit board characterized by the steps of:
    forming a circuit board of electrically insulative material and supporting, on a generally planar face, at least one groove, said groove plated with an electrically conductive material;
    filling said at least one groove at least partially with a fluid insulator;
    inserting, into said at least one groove, an elongate conductor, such that said conductor fits into said groove until it is approximately flush with the planar surface of said substrate, and such that said fluid insulator is displaced until it also is approximately flush with said planar surface of said substrate, and such that said elongate conductor is spaced apart from said conductive material plated onto said groove; and
    curing said fluid insulator such that it becomes solid.

10. The method of claim 9 wherein said forming step forms a groove that is approximately 15 mils deep, and 7 mils wide.

11. The method of claim 9 wherein said filling step fills said at least one groove at least partially with a heat curable epoxy.

12. A method as claimed in claim 9 further comprising the step of etching to remove a thin, generally planar, sheet of copper which supports said elongate conductor during said inserting step.

* * * * *